United States Patent
Fedan

(10) Patent No.: US 8,339,220 B2
(45) Date of Patent: Dec. 25, 2012

(54) SURFACE ACOUSTIC WAVE RESONATOR FILTER

(75) Inventor: Orest Fedan, Belmont, MA (US)

(73) Assignee: LoJack Operating Company, LP, Canton, MA (US)

( * ) Notice: Subject to any disclaimer, the term of this patent is extended or adjusted under 35 U.S.C. 154(b) by 416 days.

(21) Appl. No.: 12/586,054

(22) Filed: Sep. 16, 2009

(65) Prior Publication Data

US 2011/0063051 A1    Mar. 17, 2011

(51) Int. Cl.
*H03H 9/64* (2006.01)
*H03H 9/52* (2006.01)

(52) U.S. Cl. ........................................ 333/195; 333/193

(58) Field of Classification Search .......... 333/193–196; 310/313 R, 313 B, 313 C, 313 D; 331/107 A, 331/154, 155
See application file for complete search history.

(56) References Cited

U.S. PATENT DOCUMENTS

| | | | | |
|---|---|---|---|---|
| 1,974,081 | A * | 9/1934 | Mason | 333/190 |
| 2,738,465 | A * | 3/1956 | Schramm | 333/28 R |
| 5,043,681 | A * | 8/1991 | Tanemura et al. | 331/107 A |
| 5,291,159 | A * | 3/1994 | Vale | 333/188 |
| 5,329,256 | A * | 7/1994 | Higgins, Jr. | 331/107 A |
| 6,380,816 | B1 * | 4/2002 | Okaguchi | 331/107 A |
| 6,525,624 | B1 * | 2/2003 | Hikita et al. | 333/133 |
| 6,552,621 | B2 * | 4/2003 | Northam | 331/108 R |
| 6,909,338 | B2 * | 6/2005 | Omote | 333/133 |
| 7,030,718 | B1 * | 4/2006 | Scherer | 333/188 |
| 7,199,674 | B2 * | 4/2007 | Ash | 331/107 A |
| 7,573,354 | B2 * | 8/2009 | Nishihara et al. | 333/133 |
| 2006/0164183 | A1 * | 7/2006 | Tikka et al. | 333/133 |
| 2007/0046394 | A1 * | 3/2007 | Inoue et al. | 333/133 |

* cited by examiner

*Primary Examiner* — Barbara Summons
(74) *Attorney, Agent, or Firm* — Goodwin Procter LLP

(57) ABSTRACT

A SAW resonator filter including a SAW resonator, and a first inductive reactance in parallel with the SAW resonator for shifting the null points below and above the center frequency for establishing substantially symmetrical attenuation about the center frequency.

5 Claims, 5 Drawing Sheets

SURFACE ACOUSTIC WAVE RESONATOR FILTER

FIELD OF THE INVENTION

This invention relates to a new surface acoustic wave (SAW) resonator filter.

BACKGROUND OF THE INVENTION

SAW filters have been used to allow passage of a narrow range of frequencies (bandwidth) while sharply attenuating all frequencies outside that bandwidth. The center frequency of SAW filters varies with temperature, ageing and unit to unit variations. Therefore, in order that the desired frequency always is allowed to pass, the SAW filter must have a substantial bandwidth. This requires more circuit area and greater cost. The resonant frequency of SAW resonators also varies with temperature, ageing and unit to unit variations. The resonant frequency of a SAW resonator is a single frequency and not a band of frequencies. SAW resonators could not be used as filters because the desired frequency could suffer attenuation if the resonant frequency of the SAW resonator departs from the desired frequency. SAW resonators are used to make oscillators with the SAW resonator stabilizing the oscillation frequency. The oscillator must be able to tolerate the small frequency shift of the resonant frequency of the SAW resonator over temperature, time and unit to unit variation

SUMMARY OF THE INVENTION

In accordance with various aspects of the subject invention in at least one embodiment the invention presents an advantageous SAW resonator filter and more particularly one which has broader bandwidth but less attenuation at the center frequency, smaller size and lower cost and tunable nulls for tailoring the filtering characteristic to variously provide more symmetrical filtering, a flatter or broader response and less attenuation to the center frequency.

The invention results from the realization that, in part, an improved SAW resonator filter in various aspects can be achieved by having a first inductive reactance in parallel with a SAW resonator for shifting the null points below and above the center frequency for establishing symmetrical attenuation about the center frequency and the further realization that a second inductive reactance in series with the SAW resonator can achieve a flatter response and less attenuation at the center frequency.

The subject invention, however, in other embodiments, need not achieve all these objectives and the claims hereof should not be limited to structures or methods capable of achieving these objectives.

This invention features A SAW resonator filter including a SAW resonator, and a first inductive reactance in parallel with the SAW resonator for shifting the null points below and above the center frequency for establishing substantially symmetrical attenuation about the center frequency.

In a preferred embodiment there may be a second inductive reactance in series with the SAW resonator to shift the series resonance point for flattening the series resonance and reducing attenuation at the center frequency. There may be a first capacitance in series with the first inductive reactance for controlling location of the null points and adjusting the symmetry of attenuation. A second capacitance may be in series with the second inductive reactance for controlling the series resonance point for flattening the series resonance and reducing attenuation at the center frequency. The first capacitance may be variable. The second capacitance may be variable.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
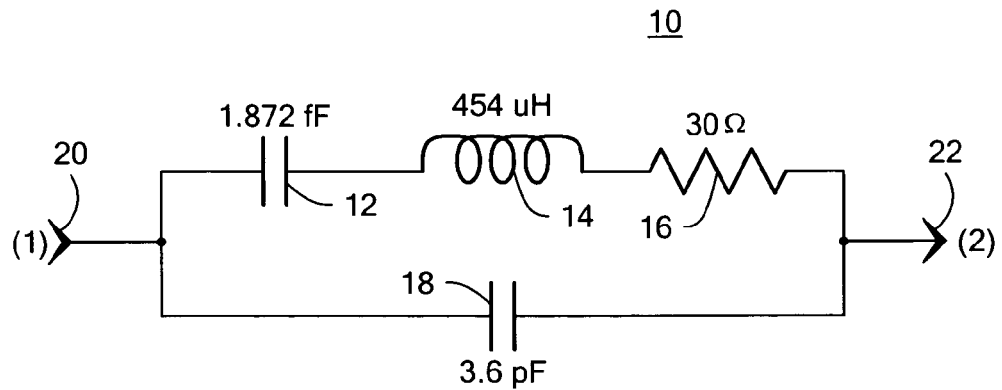
FIG. 1 is an equivalent circuit of a prior art SAW resonator.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

This disclosure describes a SAW resonator as a filter. The SAW resonator filter of this invention has good attenuation on both sides of the center frequency and even provides a mechanism for tuning the filter to counteract variations in the included SAW resonator. This provides a lower cost and possibly a smaller filter especially when only a moderate amount of filtering is required.

Figure 2:
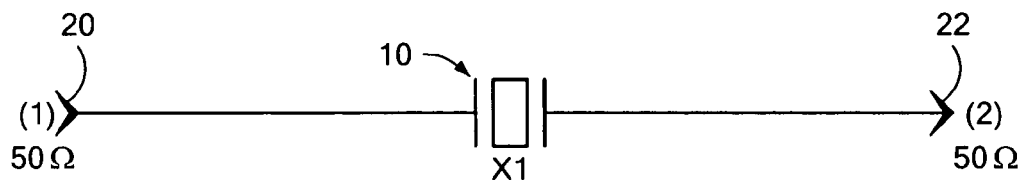
FIG. 2 is a diagram showing a typical arrangement for measuring the resonant frequency of the SAW resonator of FIG. 1.
Figure 3:
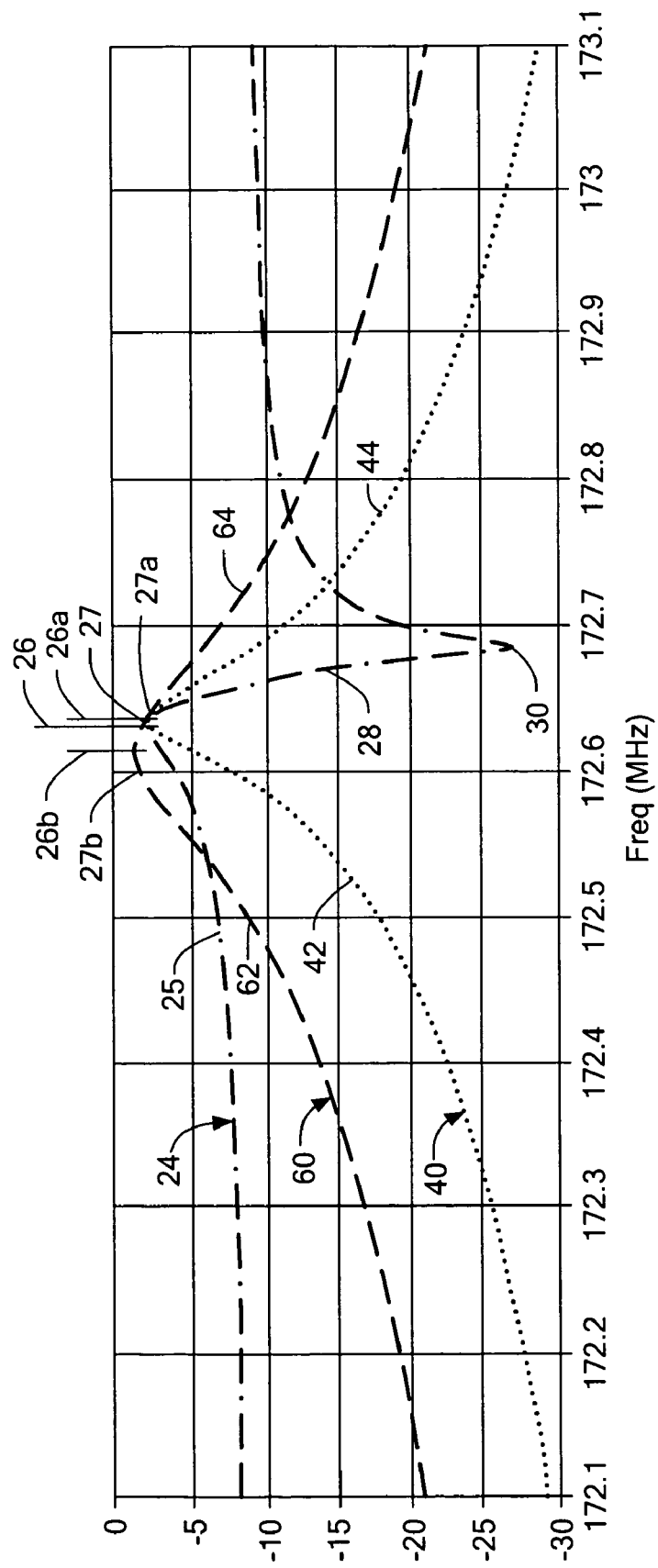
FIG. 3 illustrates the filter response for the SAW filter of FIG. 1 and SAW resonator filter of FIGS. 4 and 5 according to this invention.

There is shown in FIG. 1 an equivalent circuit of the prior art SAW resonator 10, with typical part values for a resonant frequency of 172.62 MHz. SAW resonator 10 includes a motional capacitance 12, motional inductance 14, series resistance 16, and inherent package capacitance 18. SAW resonator 10 also includes terminals 20 and 22. The resonant frequency of SAW resonator 10 is measured as shown in FIG. 2 by connecting its terminals 20 and 22 to a network analyzer. A typical simulated measurement appears at 24, FIG. 3, showing in peak area 27 a center frequency 26, which is determined by the series resonant branch including capacitance 12, inductance 14, and resistance 16. At the center frequency there is a small attenuation in the neighborhood of three or four dB. Below center frequency 26 in area 25 there is some attenuation but after the center frequency 26 in the area indicated at 28 there is a strong attenuation defining a null point 30 which is determined by the parallel resonance of the package capacitance 18 in conjunction with the series resonance branch of capacitance 12, inductance 14, and resistance 16. The sharpness of the attenuation at 28 is not desirable, as any slight drift due to age or temperature can seriously attenuate the signal. A second null point of characteristic 24 occurs far to the left (at zero) and is not shown in FIG. 3.

Figure 4:
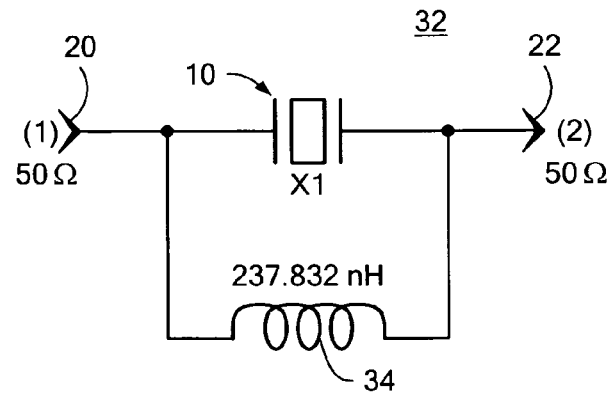
FIG. 4 is a schematic diagram of a SAW resonator filter according to this invention.

In accordance with this invention a SAW resonator filter 32, FIG. 4, combines the SAW resonator 10 with a first inductive reactance 34 in parallel. The addition of this inductor or inductive reactance 34 shifts the null points both below and above the center frequency 26 to the right, that is to higher frequencies: null point 30 above the center frequency 26 is moved to the right to even higher frequencies and the null point to the left of center frequency 26 on characteristic 24 is also moved to higher frequencies to the right resulting in a characteristic 40, FIG. 3 which is much more symmetrical about its center frequency 26a as can be seen by the roll offs at 42 and 44. Thus, the addition of inductance 34 shifts the resonance to the right or to a high frequency and creates a parallel resonance to the left to produce the symmetrical shape of characteristic 40. Characteristic 40 has its center frequency 26a shifted slightly higher or to the right and its peak 27a is somewhat lower than peak 27 of characteristic 24 indicating a greater attenuation. Nevertheless, in some applications this filter response is adequate and sufficient. Characteristic 40, while symmetrical still has a fairly steep slope, see roll offs 42 and 44. For example, a shift of only 30 kHz can drop the signal by as much as six to eight dB.

While both the loss of a few dB and the sharp falloff are tolerable in many circumstances, a further implementation can also solve this problem. In some cases loss of the desired signal cannot be handled. And, the steep increase in attenuation on either side of the center frequency 26a may result in unacceptably high loss of the desired signal if the SAW resonant frequency shifts due to temperature, aging or unit variations.

Figure 5:
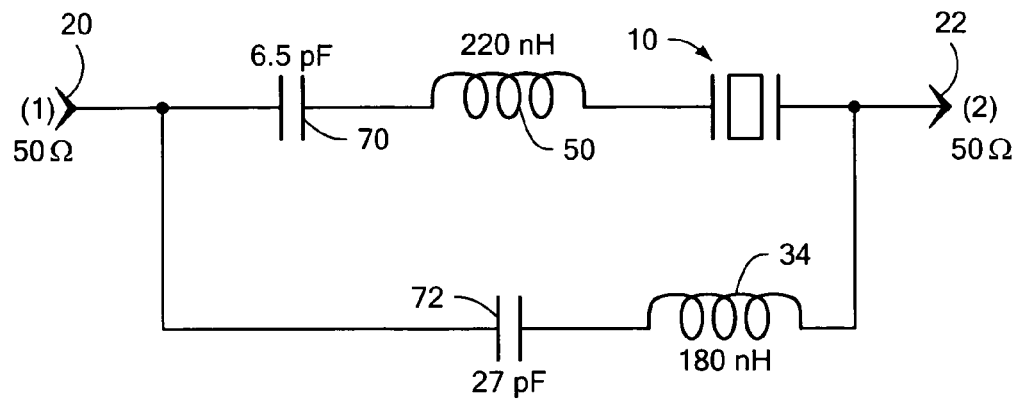
FIG. 5 is a schematic diagram of another embodiment of a SAW resonator filter according to this invention.

Both of these problems may be solved by shifting the center frequency to a lower frequency farther away from the SAW resonant frequency, this flattens the response: reduces the steepness of the drop offs on either side. It also reduces the loss at the center frequency. This is accomplished as shown in FIG. 5 by adding a second inductive reactance 50 in series with SAW resonator 10. The result of the addition of the second inductive reactance, inductor 50, is shown by characteristic 60, FIG. 3, where the roll offs, slopes 62 and 64, have become much less steep and the peak area 27b at center frequency 26b has been flattened so that some shifts can be tolerated without a steep decline or attenuation in the center frequency signal. The addition of the inductance of the second inductive reactance 50, FIG. 5, shifts the series resonance to the left toward the lower frequencies. Note that the addition of inductor 50 also raises the peak, that is, lowers the attenuation of characteristic 60 at the center frequency 26b. Two additional capacitances are shown in FIG. 5, series capacitance 70 and parallel capacitance 72. These are not required. They may be present for two reasons. First out of practicality, to provide an easy mechanism for tuning the above mentioned resonances when the inductances 34 and 50 can only be gotten in certain denominations. In addition these capacitances may be made variable, such as, by implementation with varactors that the resonance can be adjusted at will. Capacitor 70 adjusts the amount of flattening and center frequency shift available from inductance 50 and capacitance 72 adjusts the symmetry in attenuation afforded by inductance 34.

Figure 6:
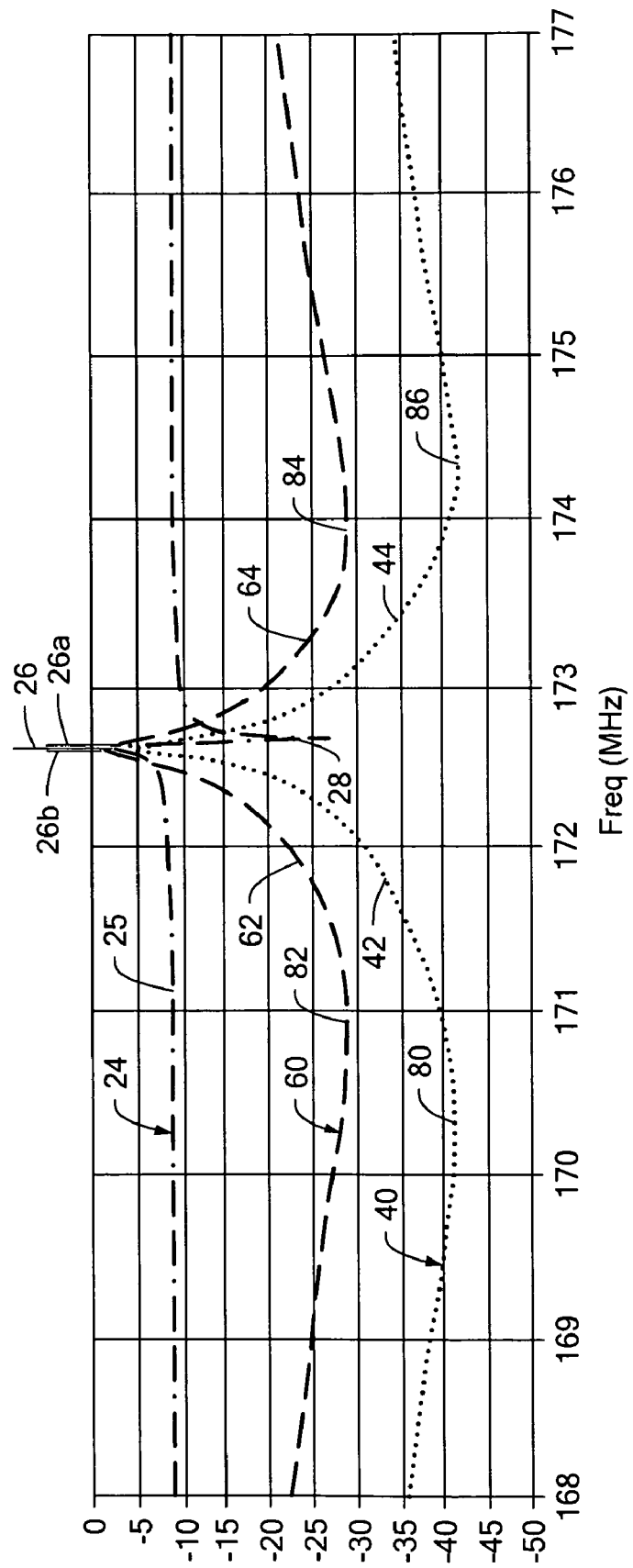
FIG. 6 is a reduced scale view similar to FIG. 3 showing null points relocated to obtain a more symmetrical characteristic according to this invention.
Figure 7:
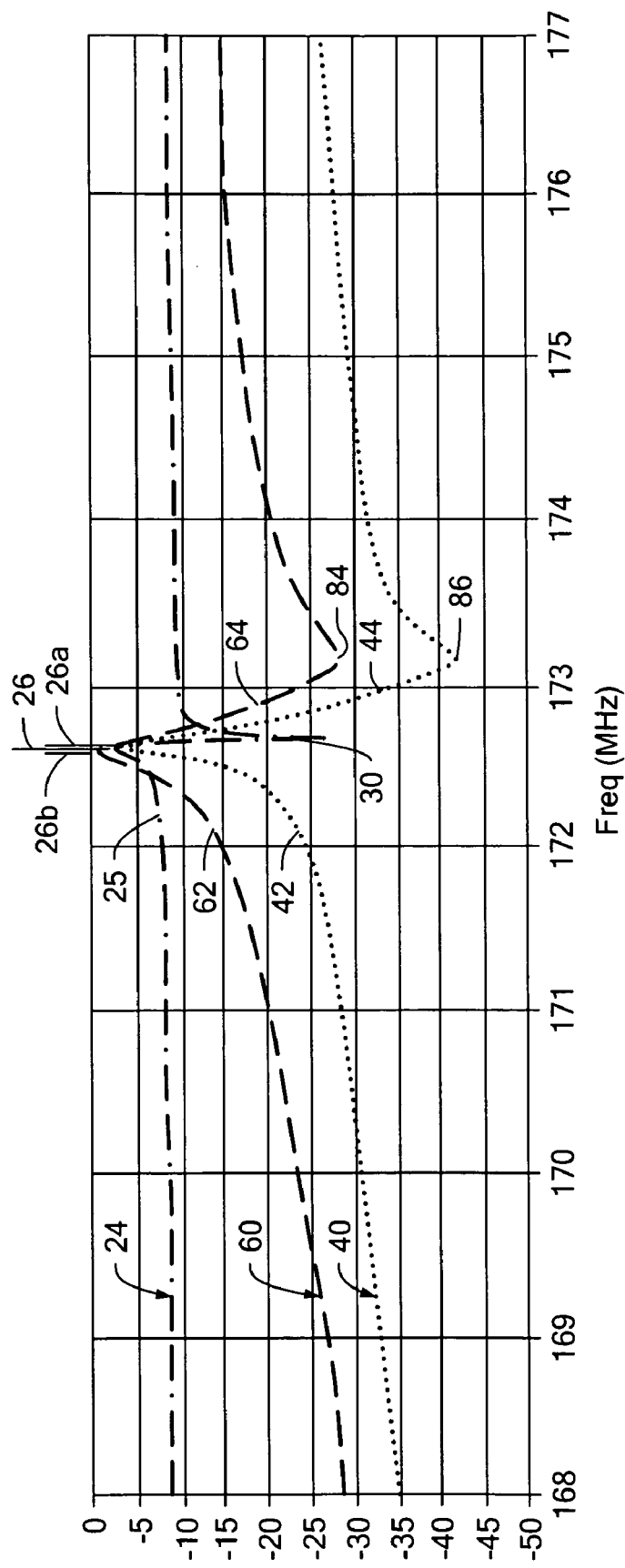
FIG. 7 is a view similar to FIG. 6 with the null points moved to lower frequency (to the left) to provide an asymmetrical higher attenuation above the center frequency and lower attenuation below the center frequency.

An advantage of this invention is that the parallel resonance of inductor 34 with capacitance 70, inductor 50, and SAW resonator 10 provides a null (minimum response) below the center frequency as at 80 and 82, FIG. 6, while the SAW resonator 10 provides a null 84, 86 above the center frequency. Locations of these nulls 80, 82, 84 and 86 can be tuned over a broad range of frequencies, for example, by using capacitances 70 and 72. Note, they cannot be tuned independently: if one null is tuned to a lower frequency the other will go to a lower frequency as well. Such an example where the nulls are tuned to a lower frequency is shown in FIG. 7, where the higher frequency nulls 84 and 86 have been tuned to lower frequencies closer to the center frequencies and the lower frequency nulls have also been tuned to a lower frequency below the center frequencies and off the scale in FIG. 7.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A SAW resonator filter comprising:
   a SAW resonator;
   a first inductive reactance in parallel with said SAW resonator for shifting the null points below and above the center frequency for establishing substantially symmetrical attenuation about the center frequency; and
   a second inductive reactance in series with said SAW resonator to shift the series resonance point for flattening the series resonance and reducing attenuation at the center frequency.

2. The SAW resonator filter of claim 1 further including a first capacitance in series with said first inductive reactance for controlling location of said null points and adjusting the symmetry of attenuation.

3. The SAW resonator filter of claim 2 in which said first capacitance is variable.

4. The SAW resonator filter of claim 2 further including a second capacitance in series with said second inductive reactance for controlling the series resonance point for flattening the series resonance and reducing attenuation at the center frequency.

5. The SAW resonator filter of claim 4 in which said second capacitance is variable.

* * * * *